United States Patent [19]

Mellor et al.

[11] Patent Number: 5,290,183

[45] Date of Patent: Mar. 1, 1994

[54] LAMP HOLDING FIXTURE FOR CHEMICAL VAPOR DEPOSITION

[75] Inventors: Charles E. Mellor, Peabody; Robert M. Morin, Salem, both of Mass.

[73] Assignee: GTE Products Corporation, Danvers, Mass.

[21] Appl. No.: 814,858

[22] Filed: Dec. 30, 1991

[51] Int. Cl.$^5$ .................................. H01J 9/20
[52] U.S. Cl. .......................... 445/58; 118/728; 211/181
[58] Field of Search ............... 445/58, 59, 60; 118/500, 501, 428, 728; 211/181

[56] References Cited

U.S. PATENT DOCUMENTS

| | | | |
|---|---|---|---|
| 727,856 | 5/1903 | Smith | 118/501 |
| 1,062,242 | 5/1913 | Klug | 211/181 X |
| 1,290,202 | 1/1919 | Horan | 118/500 |
| 1,885,104 | 11/1932 | Bates | 211/181 |
| 1,946,711 | 2/1934 | Quisenberry | 211/181 |
| 4,945,856 | 8/1990 | Stewart | 118/728 X |
| 4,958,588 | 9/1990 | Hutchison et al. | 118/500 X |

*Primary Examiner*—Kenneth J. Ramsey
*Attorney, Agent, or Firm*—Joseph S. Romanow

[57] ABSTRACT

A holding fixture is used to hold single-ended or double-ended lamps within a chemical vapor deposition chamber. The holding fixture includes first and second wire mesh screens for holding lamps that are to be coated within the deposition chamber. A screen support is provided to secure and support each screen within the fixture. Spacers to secure the screens and supports together and provide spacing between such screens and supports. Holes may be cut in the screen to allow portions of the lamps to pass through screen. In addition, a housing may be provided for the holding fixture.

19 Claims, 5 Drawing Sheets

LAMP HOLDING FIXTURE FOR CHEMICAL VAPOR DEPOSITION

FIELD OF THE INVENTION

This invention relates generally to fixtures for holding lamps during processing and, more particularly, to fixtures for holding lamps during chemical vapor deposition.

DESCRIPTION OF THE PRIOR ART

Electric lamps, such as tungsten halogen lamps, may be configured in at least two ways. First, these lamps may be configured as single-ended lamps, such as the lamp 10 shown in FIG. 1. This single-ended lamp 10 includes a quartz or glass envelope 15 that surrounds a filament (not shown). The envelope 15 is sealed and has a pair of lead wires 12 extending from one end, The envelope 15 is sealed around the lead wires. Electric lamps may also be configured as double-ended lamps, such as the double-ended lamp 16 shown in FIG. 2. This lamp also includes a quartz or glass envelope 17 that surrounds a filament (not shown). The double-ended lamp, however, differs from the single-ended lamp in that lead wires 18a and 18b extend from opposite ends of the lamp envelope.

The envelopes of tungsten halogen lamps are frequently coated with an infrared reflective coating. The reflective coating allows visible light from the filament to pass through the lamp envelope while reflecting emitted infrared (IR) energy back toward the filament. By not permitting the IR energy to escape from the lamp envelope, the reflective coating prevents the unnecessary loss of energy in the non-visible spectrum. The reflected energy helps to heat the filament without requiring increased power consumption. As such, the reflective coating enhances the efficiency of the lamp.

The reflective coating is typically applied to the lamp by chemical vapor deposition. In particular, the lamp is placed into a deposition chamber, and successive thin layers are deposited on the outside of the lamp envelope. To reflect energy in the IR spectrum, successive layers of silica and tantalum may be deposited on the exterior of the lamp envelope. Other suitable materials for films that make up the reflective coating include silicon and tantalum pentoxide. The compositions and thicknesses of the layers of suitable infrared reflective coatings are known in the art.

Electric lamps such as those described above have been coated with infrared reflective coatings using holding fixtures that are not especially adapted for holding lamps. Typically, a holding fixture adapted for holding semiconductor devices has been used to hold lamps within the deposition chamber. The holding fixtures have been difficult to use and have not facilitated uniform gas flow around the lamps. As a result, the quality of the coatings has often been less than optimal.

It is, therefore, an object of the present invention to provide a holding fixture especially adapted for holding lamps during chemical vapor deposition.

It is a further object of the present invention to provide a holding fixture for holding lamps during chemical vapor deposition that facilitates uniform gas flow around the lamps.

It is still a further object of the present invention to provide a holding fixture for lamps during chemical vapor deposition that is easily used.

SUMMARY OF THE INVENTION

According to the present invention, these and other objects and advantages are achieved in a holding fixture for holding electric lamps for coating in a deposition chamber during chemical vapor depostion. The holding fixture includes first and second wire mesh screens through which respective portions of a lamp pass. The screens hold the lamp within the fixture. The holding fixture further includes means for supporting the first and second screens and for spacing the first and second screens apart. The support means preferably includes support rings secured to the screens so as to support each screen along at least a portion of its outer periphery. The holding fixture can additionally include a third screen and a support ring for the third wire mesh screen. The holding fixture can also include a housing. The housing can include vents that are preferably uniformly spaced to enhance uniform gas flow around the lamp, The holding fixture can be used with single-ended lamps or double-ended lamps. When double-ended lamps are used, no holes are cut in any of the wire mesh screens. When single-ended lamps are to be held by the fixture, holes are cut in one of the wire mesh screens so that the lamps are held at the press seal.

BRIEF DESCRIPTION OF THE DRAWINGS

The present invention is described below in detail with reference to the following drawings.

DETAILED DESCRIPTION

Figure 1:
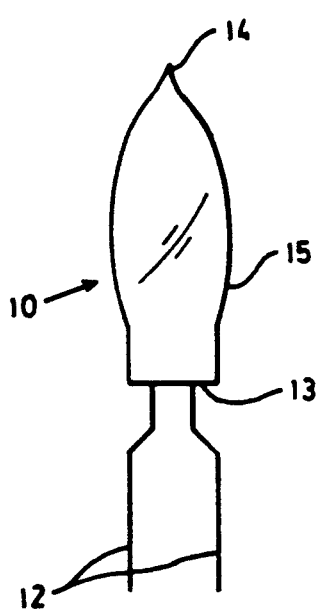
FIG. 1 is a side view of a conventional single-ended lamp.
Figure 2:
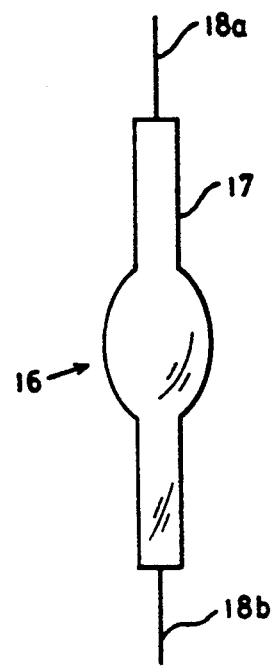
FIG. 2 is a side view of a conventional double-ended lamp.
Figure 3:
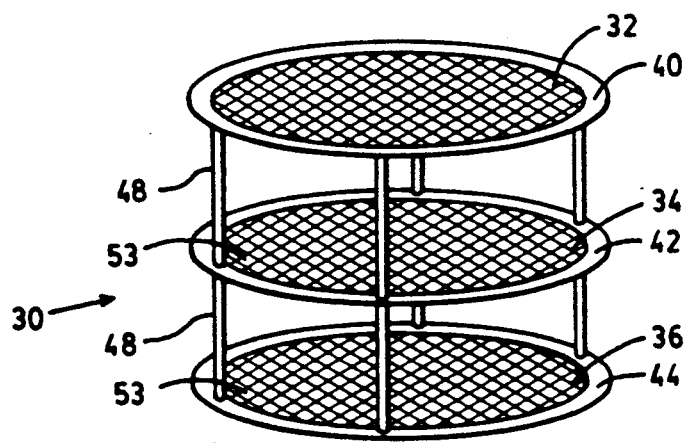
FIG. 3 is a perspective view of a holding fixture in accordance with a first embodiment of the present invention.

The present invention is described in more detail below relative to two illustrative embodiments. FIG. 3 depicts a first illustrative embodiment of a fixture for holding a lamp during chemical vapor deposition. A holding fixture 30 includes screens 32, 34 and 36 organized in a stacked arrangement as shown in FIG. 3. The screens hold lamps within a deposition chamber without impeding the gas flow around the lamps. Each screen has a corresponding support ring 40, 42 and 44 that secures the screen to the fixture 30. The support rings also constitute part of the support structure of the fixture. The support rings 40, 42 and 44 are separated by spacers 48 that serve the dual roles of interconnecting support rings and providing desired spacings between the screens 32, 34 and 36.

The embodiment of FIG. 3 employs three screens. Each of the screens performs a unique function in the fixture. Middle screen 34 serves primarily to hold the lamps. As described below, screen 34 holds the lamps at the press seals when single-ended lamps are being coated or holds the lamps at the lead wires when double-ended lamps are being coated, Upper screen 32 holds the lamps by the lead wires when double-ended lamps are being coated. When single-ended lamps are being coated, screen 32 does not hold the lamps, but merely provides structural support for the fixture. It is preferred that upper screen 32 be removable so that lamps may be easily placed in the fixture. Lower screen 36 holds the lamps by the lead wires when single-ended lamps are being coated but only provides structural support when double-ended lamps are being coated. Screen 36 may be connected to the fixture such that it is readily removable. Other embodiments may employ a different number of screens, based on the teachings contained herein.

The screens 32, 34 and 36 are preferably made of a wire mesh cloth, such as #316 stainless steel cloth. The material from which the mesh screens 32, 34 and 36 are made must not react with the chemicals that are used within the chemical vapor deposition chamber. In addition, the wire mesh material must be sufficiently rigid to hold the lamp without significant sagging or bending. The wire mesh cloth must have openings that are large enough for the lead wires of the lamps to pass through. The size of the openings is thus chosen based upon the size of the lead wires of the lamps. In general, an opening of 1/16 inch on a side is appropriate. The diameter of the wires that make up the screens also depends on the application, but a wire diameter of 0.18 inch is generally appropriate for most applications.

Figure 4A:
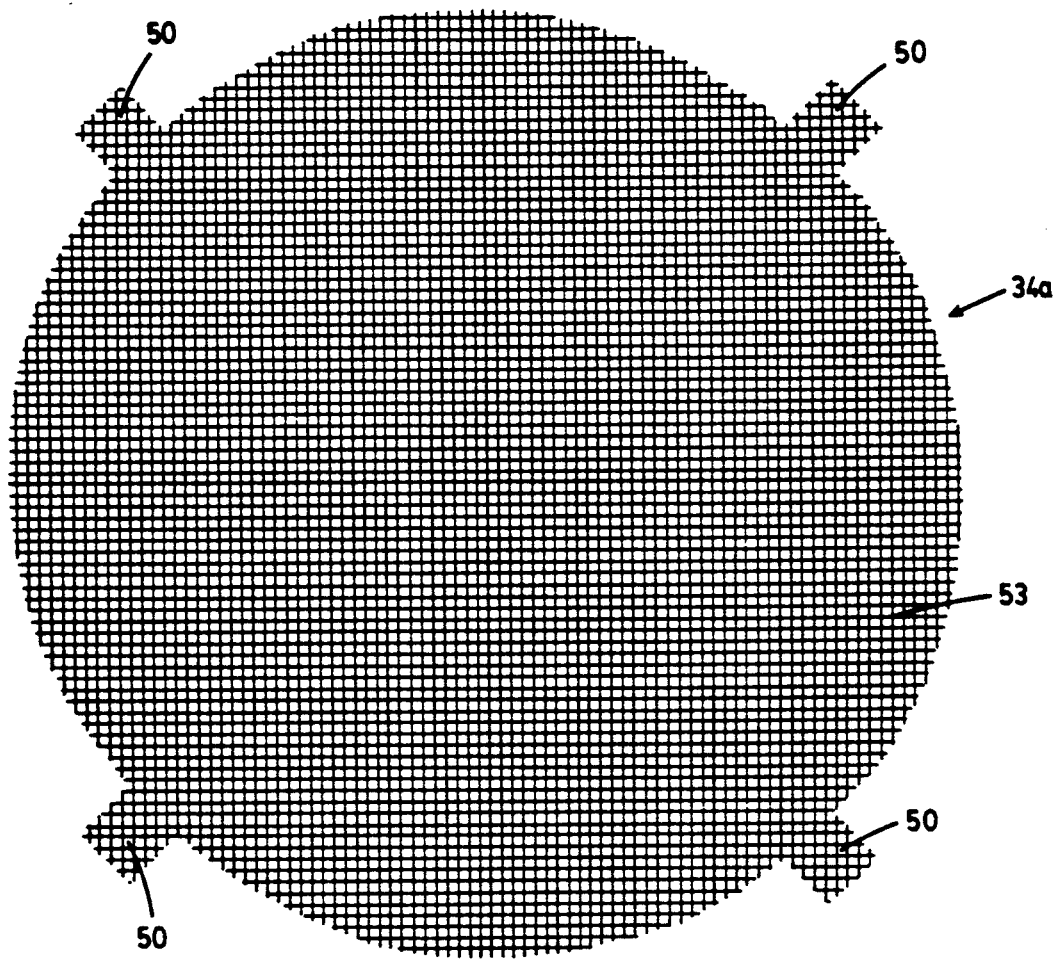
FIGS. 4a and 4b show plan views of screens employed within the holding fixture of FIG. 3.
Figure 4B:
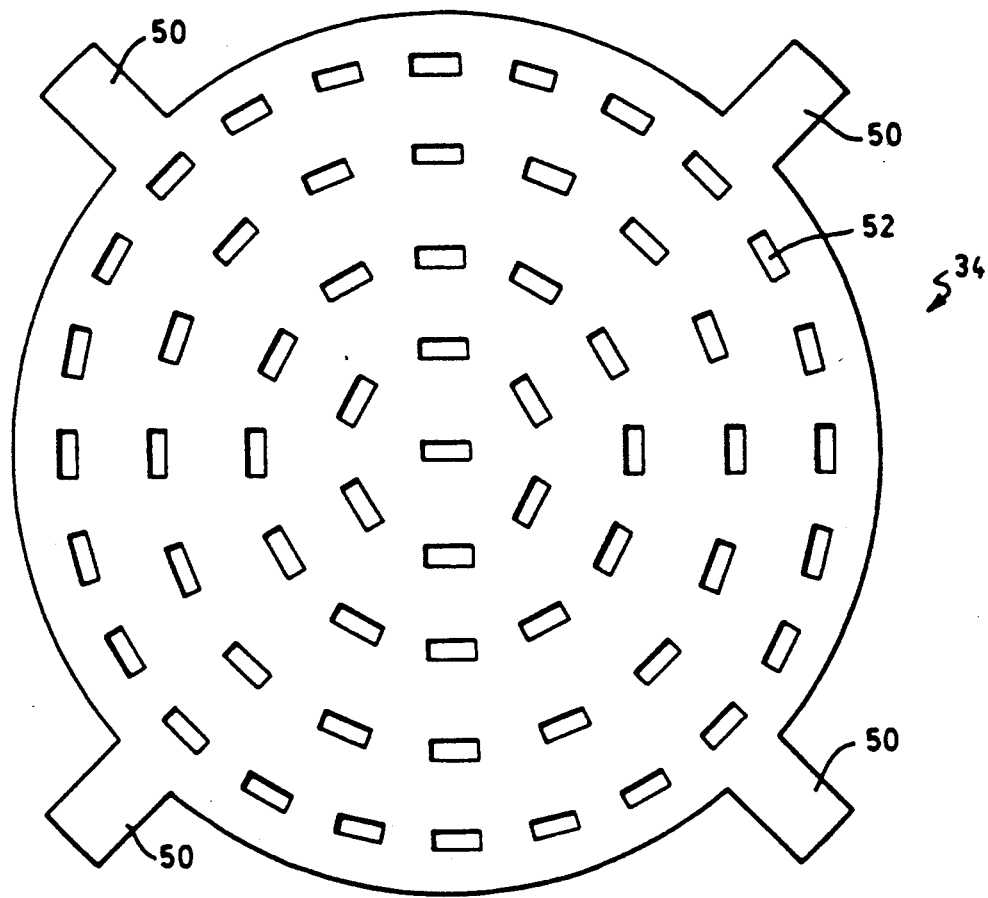

FIGS. 4a and 4b show screens 34 and 34a for use with double-ended lamps and single-ended lamps, respectively. The circular shape chosen for screen 34 is merely illustrative, and other shapes are equally suitable. Tabs 50 are provided in the screen to secure the screen to the respective support rings 40, 42 and 44. The tabs 50 can be secured to the support rings 40, 42 and 44 by electric spot welding, or by bending the tabs 50 over the outer periphery of the support rings. Other suitable connection techniques can be used. Whatever connection technique is employed, it must not cause contamination inside the reaction chamber during deposition.

When the holding fixture 30 (Fig. 3) is used for coating double-ended lamps, no holes are cut in screen 34. In this case, the lead wires of the lamp pass through the openings 53 (FIG. 4a) in the screen 34. Thus, screen 34 has a configuration as shown in FIG. 4a. When the holding fixture is used for coating single-ended lamps, holes 52 are cut in the screen 34a to allow the press seals of the lamps to pass through the screen 34a. FIG. 4b shows an exemplary pattern of rectangular holes 52 in the screen 34a to facilitate the holding of multiple single-ended lamps. The holes have a pattern that seeks to maximize use of the available space on the screen 34a in a uniform fashion. The pattern shown in FIG. 4b is merely illustrative, other suitable patterns can be utilized. Whatever pattern is chosen, the holes 52 should be sufficiently spaced (e.g. ¼" between lamps) to provide uniform gas flow around the lamps. During chemical vapor deposition, the press seals of the lamps are secured within the holes 52. Only screen 34a is required to have holes 52. However, in alternative embodiments more than one screen may have holes.

Preferably, all of the screens 32, 34 and 36 (FIG. 3) of the holding fixture 30 are of similar construction. Specifically, the screens 32, 34 and 36 are preferably made of the same material and are oriented so that the meshes of the screens are in alignment. The screens are preferably of the same size and shape, and the spacing between the openings in the meshes of screens are preferably matched. By employing like screens, the uniformity of gas flow around the lamps is enhanced. There may, nevertheless, be applications in which the parameters of the screens are varied.

Each support ring 40, 42 and 44 (FIG. 3) is a ring made of a suitable material, such as shim stock stainless steel. The material should be selected so that it is not reactive with gases used in the chemical vapor deposition chamber. Holes are punched or drilled in the support rings 40, 42 and 44 so that spacers 48 can be connected to the support rings. The inner diameters of the support rings are dictated by the size of the screen 34. Hence, if a larger screen is employed, a larger inner diameter must be provided.

Each spacer 48 is a stud having a central cylindrical region and smaller diameter cylindrical pins on each end. The pins have a diameter selected to pass through the holes in the support rings 40, 42 and 44. The pins are secured to the support rings by welding or by a cotter pin that passes through a hole in the pin. One benefit of using the cotter pin is that the spacers and support rings can be easily disassembled.

Figure 5A:
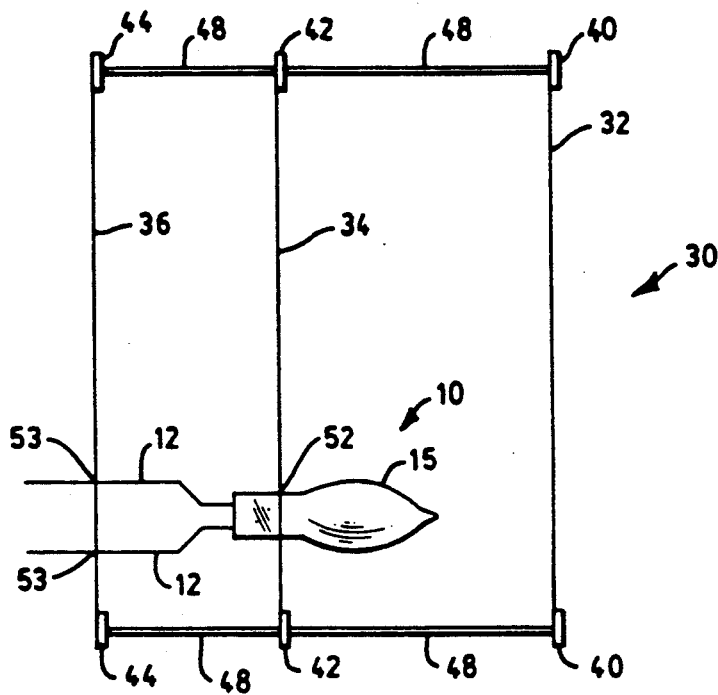
FIG. 5a is a cross-sectional view of a holding fixture for holding single-ended lamps in accordance with the first embodiment of the present invention.

FIG. 5a shows a cross-sectional view of the holding fixture 30 for holding single-ended lamps. In most instances, more than one lamp is held by the fixture 30, but for simplicity and for illustrative purposes, a single lamp 10 is shown in FIG. 5a. Initially, the screen 32 is removed to provide access to screen 34. Once screen 32 has been removed, single-ended lamp 10 is manually passed through hole 52 (FIG. 4b) in screen 34 so that the electric leads of the lamp pass through openings in screen 36, and the press seal of the lamp is held by screen 34. The envelope 15 of the lamp is positioned between screens 34 and 32, and the lead wires 12 extend through openings in screen 36. When the lamp is properly positioned, screen 32 is secured to the fixture, and the fixture is placed in the deposition chamber. Typically, multiple lamps are placed in the fixture before screen 32 is secured to the fixture.

When the fixture 30 is fully loaded with lamps to be coated, it is placed within the deposition chamber for chemical vapor deposition. The positioning of the fixture 30 within the deposition chamber depends upon whether a horizontal or a vertical reactor is employed. In general, the fixture 30 is placed within the chamber so that the gas flow is parallel to the long dimensions of the lamp envelopes. In other words, the gas flow is in a direction that is perpendicular to the planes of the screens 32, 34 and 36. When deposition is completed, the fixture 30 is removed from the deposition chamber and is disassembled. Disassembly usually involves removal of screen 32 to gain access to the coated lamps held by screens 34 and 36. If screen 32 is welded to the fixture 30, the welds must be broken to disassemble the fixture.

Figure 5B:
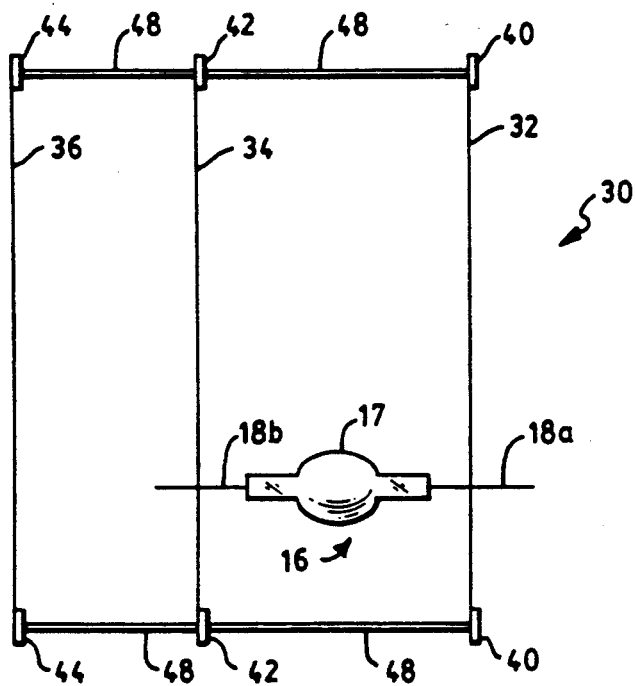
FIG. 5b is a cross-sectional view of a holding fixture for holding double-ended lamps in accordance with the first embodiment of the present invention.

FIG. 5b shows a cross-sectional view of a holding fixture 30 for holding double-ended lamps. In this fixture, screen 34 has no holes 52. otherwise, the fixture of FIG. 5b is the same as the fixture of FIG. 5a. To utilize the fixture of FIG. 5b, screen 32 is removed from the fixture. Then, lead wire 18a of the double-ended lamp 16 is passed through the mesh of screen 32. A piece of styrofoam or a similar material is placed behind screen 32 to firmly hold the double-ended lamp 16 in place after it passes through screen 32. The electric lead 18b on the other end of the double-ended lamp 16 is then guided through the mesh in screen 34. Screen 32 is then secured to the fixture 30. The approach of employing styrofoam or a similar material is particularly useful when multiple lamps are to be held within the fixture 30. The above-described technique is merely illustrative, and other suitable techniques can be used for positioning the double-ended lamps within the fixture 30. When the lamp 16 is in proper position, the envelope 17 is situated between screens 32 and 34, lead wire 18b passes through screen 34, and lead wire 18a passes through screen 32.

When the lamp 16 has been positioned within the holding fixture 30, the fixture is placed within the chemical vapor deposition chamber as described above relative to FIG. 5a. The chemical vapor deposition system is then used to deposit a reflective coating on each lamp. After the coatings have been applied, the fixture is removed from the chamber and is disassembled to gain access to the coated lamps.

Figure 6:
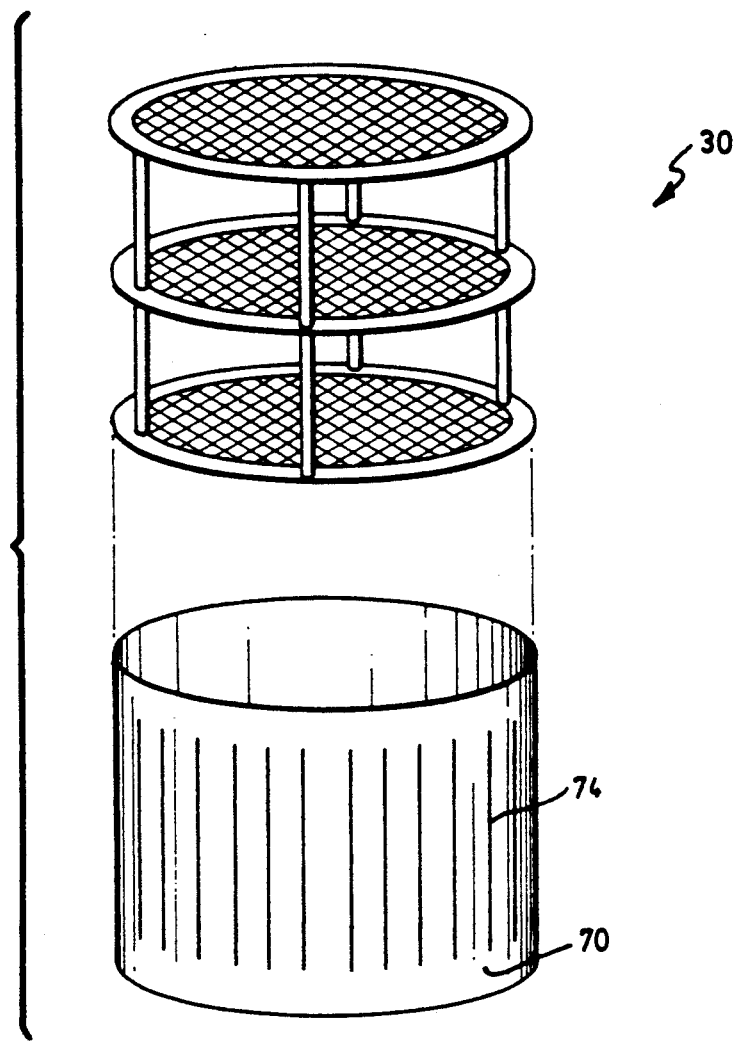
FIG. 6 is a perspective, partially exploded view of a second embodiment of the present invention.

A second embodiment of the present invention is shown in FIG. 6. The second embodiment is the same as the first embodiment except that it employs a cylindrical housing 70 that circumferentially surrounds the holding fixture 30. The housing 70 can be made of stainless steel or other suitable material. The housing can be formed from a sheet of stainless steel having a thickness on the order of 0.003 inch to 0.005 inch. Vents 74 are provided around the outer circumference of the housing 70. It is preferred that the vents be uniformly spaced to enhance the uniformity of gas flow to the lamps within the holding fixture 30. The housing is secured to the fixture 30 by suitable means such as welding or a latch mechanism.

While the present invention has been shown with respect to preferred embodiments thereof, those skilled in the art will know of other alternative embodiments which do not depart from the spirit and scope of the invention as defined in the appended claims.

We claim:

1. A holding fixture for holding at least one electric lamp for coating in a deposition chamber during chemical vapor deposition, said electric lamp comprising a light-transmissive envelope having an outside surface on which said coating will be deposited, at least one end having means for sealing said lamp, and two lead-in wires protruding from said lamp envelope, said holding fixture comprising:
   (a) first and second spaced-apart sufficiently rigid wire-mesh screens, said first screen being adapted to receive a first portion of said lamp, said second screen being adapted to receive a second portion of said lamp, such that when properly spaced apart both of said screens retain said lamp in a fixed position with respect to said holding fixture;
   (b) means for spacing apart said first and second wire-mesh screens such that said first screen is substantially parallel to said second screen, said first screen may receive said first portion of said lamp, said second screen may receive said second portion of said lamp, and said spacing-apart means do not substantially restrict the free flow of chemical vapor within said deposition chamber parallel to said screens; and
   (c) said first and second screens and said means for spacing apart said first and second screens are fabricated from materials which are capable of withstanding the high ambient temperatures occurring during said chemical vapor deposition, which will not react with the chemicals of said chemical vapor deposition, and which will not contaminate said chemical vapor deposition.

2. A holding fixture as described in claim 1 wherein said first portion of said lamp is the first of said lead-in wires.

3. A holding fixture as described in claim 1 wherein said second portion of said lamp is the second of said lead-in wires.

4. A holding fixture as described in claim 3 wherein the mesh size of said second screen is such that said second lead-in wire may pass through said mesh.

5. A holding fixture as described in claim 2 wherein the mesh size of said first screen is such that said first lead-in wire may pass through said mesh.

6. A holding fixture as described in claim 1 wherein said first portion of said lamp is said end of said lamp.

7. A holding fixture as described in claim 6 wherein said second portion of said lamp is both of said lead-in wires.

8. A holding fixture as described in claim 6 wherein said end of said lamp includes a press seal and said first portion of said lamp is said press seal.

9. A holding fixture as described in claim 8 wherein said first screen has at least one hole therein, said hole being adapted to receive said press seal.

10. A holding fixture as described in claim 9 wherein said first screen has a plurality of said holes therein.

11. A holding fixture as described in claim 6 wherein said first screen has at least one therein, said hole being adapted to receive said end of said lamp.

12. A holding fixture as described in claim 1 wherein said first wire-mesh screen includes a first rigid peripheral ring and a portion of the periphery of the wire mesh of said first screen is mounted in said first ring such that said wire mesh is taut.

13. A holding fixture as described in claim 12 wherein said second wire-mesh screen includes a second rigid peripheral ring and a portion of the periphery of the wire mesh of said second screen is mounted in said second ring such that said wire mesh is taut.

14. A holding fixture as described in claim 13 wherein said means for spacing apart said first and second screens comprises a rigid rod with first and second ends, said first end of said rod being securely fastened to said first ring and said second end of said rod being securely fastened to said second ring.

15. A holding fixture as described in claim 14 wherein said fixture includes a housing at least partially surrounding said first and second screens, said housing having a plurality of vents.

16. A holding fixture as described in claim 15 wherein said housing is substantially cylindrical in shape and said vents are spaced apart uniformly in the surface of said housing.

17. A holding fixture as described in claim 1 wherein said wire mesh of said first and second screens is stainless steel cloth.

18. A holding fixture as described in claim 1 wherein said fixture further includes a third spaced-apart sufficiently rigid wire-mesh screen and means for spacing apart said third screen from said first and second screens.

19. A holding fixture as described in claim 1 wherein said fixture includes means for removing and reinstalling at least one of said screens.

* * * * *